United States Patent
Koo et al.

(10) Patent No.: US 7,335,917 B2
(45) Date of Patent: Feb. 26, 2008

(54) THIN FILM TRANSISTOR USING A METAL INDUCED CRYSTALLIZATION PROCESS AND METHOD FOR FABRICATING THE SAME AND ACTIVE MATRIX FLAT PANEL DISPLAY USING THE THIN FILM TRANSISTOR

(75) Inventors: Jae-Bon Koo, Yongin-si (KR); Sang-Gul Lee, Gyeonggi-do (KR)

(73) Assignee: Samsung SDI Co., Ltd., Suwon (KR)

( * ) Notice: Subject to any disclaimer, the term of this patent is extended or adjusted under 35 U.S.C. 154(b) by 361 days.

(21) Appl. No.: 10/992,856

(22) Filed: Nov. 22, 2004

(65) Prior Publication Data

US 2005/0116292 A1    Jun. 2, 2005

(30) Foreign Application Priority Data

Nov. 27, 2003    (KR) .................. 10-2003-0085247

(51) Int. Cl.
*H01L 29/94* (2006.01)

(52) U.S. Cl. .................. 257/72; 257/368; 257/E51.005; 257/E29.151

(58) Field of Classification Search .................. 257/59, 257/72, 347, E51.005, E29.151, 351, 368–369
See application file for complete search history.

(56) References Cited

U.S. PATENT DOCUMENTS

2002/0056839 A1* 5/2002 Joo et al. .................. 257/63
2003/0155860 A1* 8/2003 Choi et al. .................. 313/498

* cited by examiner

*Primary Examiner*—Thanhha S. Pham
(74) *Attorney, Agent, or Firm*—H.C. Park & Associates, PLC

(57) ABSTRACT

Provided is a thin film transistor that may be manufactured using Metal Induced Crystallization (MIC) and method for fabricating the same. Also provided is an active matrix flat panel display using the thin film transistor, which may be created by forming a crystallization inducing metal layer below a buffer layer and diffusing the crystallization inducing metal layer. The thin film transistor may include a crystallization inducing metal layer formed on an insulating substrate, a buffer layer formed on the crystallization inducing metal layer, and an active layer formed on the buffer layer and including source/drain regions, and including polycrystalline silicon crystallized by the MIC process.

9 Claims, 9 Drawing Sheets

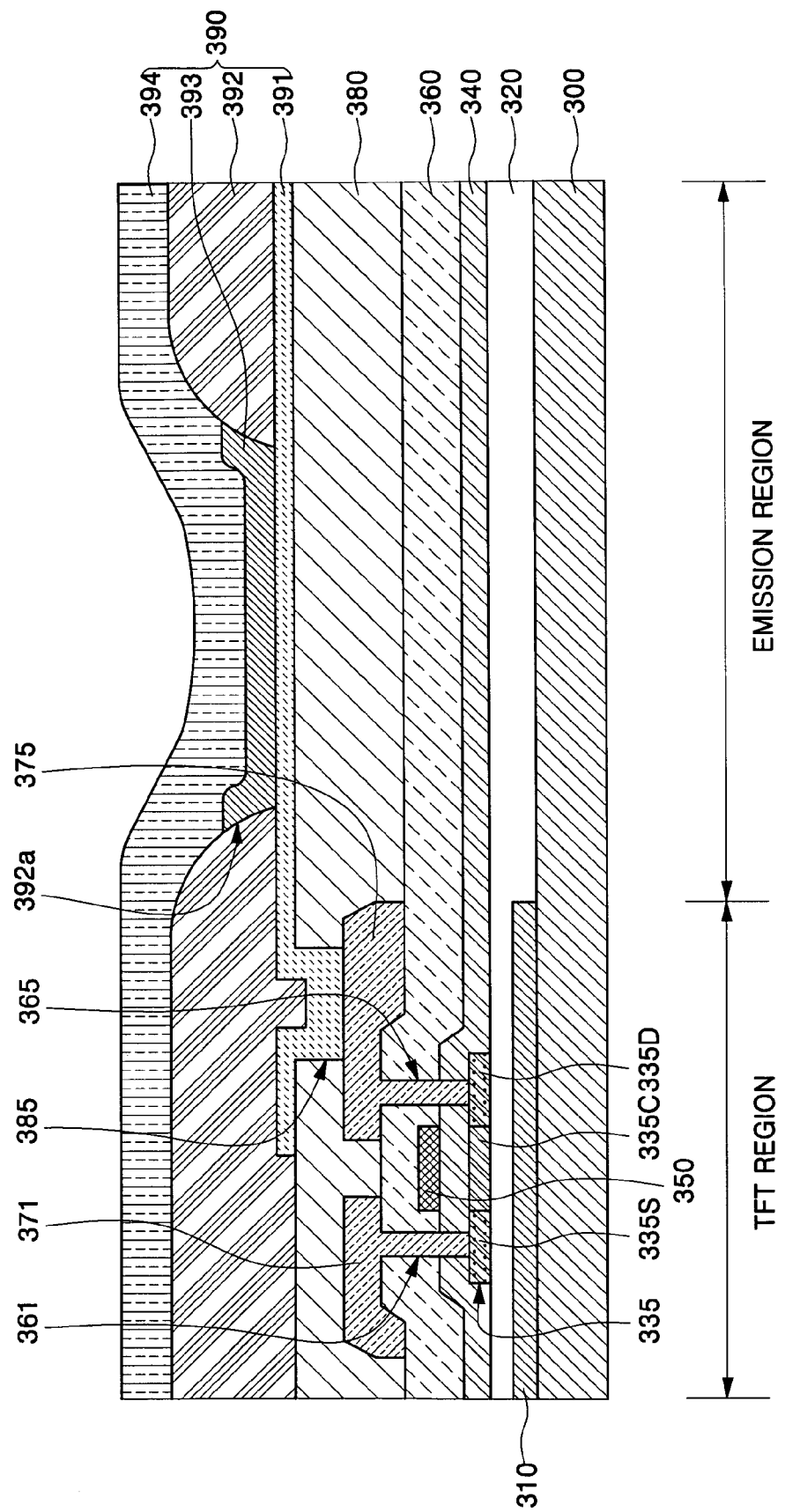

THIN FILM TRANSISTOR USING A METAL INDUCED CRYSTALLIZATION PROCESS AND METHOD FOR FABRICATING THE SAME AND ACTIVE MATRIX FLAT PANEL DISPLAY USING THE THIN FILM TRANSISTOR

CROSS-REFERENCE TO RELATED APPLICATION

This application claims the benefit of Korea Patent Application No. 2003-85247 filed on Nov. 27, 2003, the disclosure of which is hereby incorporated herein by reference in its entirety.

BACKGROUND OF THE INVENTION (a) Field of the Invention

The present invention relates to a thin film transistor using a Metal Induced Crystallization (MIC) process and method for fabricating the same, and an active matrix flat panel display using the thin film transistor. More particularly, the invention relates to a thin film transistor using a Metal Induced Crystallization (MIC) process and method for fabricating the same. The invention also relates to an active matrix flat panel display using the thin film transistor, which is formed by the method including forming a crystallization inducing metal layer beneath a buffer layer to diffuse the crystallization inducing metal layer.

(b) Description of the Related Art

A method for forming a polycrystalline silicon layer used for the active layer of the thin film transistor comprises depositing an amorphous silicon layer on an insulating substrate, and then performing crystallization at a predetermined temperature.

Solid Phase Crystallization (SPC) by means of thermal treatment, Eximer Laser Annealing (ELA) by means of laser crystallization and Metal Induced Crystallization (MIC), or the like may be employed to crystallize the amorphous silicon layer.

However, the SPC method requires a high temperature for the crystallization and a long time for the process, and the ELA method has the following problems: high-priced equipment investment, temporal and spatial unevenness caused by laser instability, and striped defects due to the laser.

On the other hand, the MIC method has an advantage in that the conventional thermal treatment equipment may be employed, but only a relatively low processing temperature and short time is required for processing.

FIGS. 1A, 1B, 1C, and 1D show cross-sectional views of the process for explaining a method for fabricating a thin film transistor using the conventional metal induced crystallization method.

As shown in FIG. 1A, an amorphous silicon layer 120 may be formed on an insulating substrate 100 having a buffer layer 110, and a crystallization inducing metal layer 130 may be formed on the amorphous silicon layer 120 to perform the MIC process.

As shown in FIG. 1B, the insulating substrate 100 on which the crystallization inducing metal layer 130 is already formed may be subject to thermal treatment in a furnace to crystallize the amorphous silicon layer 120 into a polycrystalline silicon layer 123.

As shown in FIG. 1C, after the crystallization inducing metal layer 130 is removed, the polycrystalline silicon layer 123 may be patterned to form an active layer 125 primarily consisting of polycrystalline silicon.

As shown in FIG. 1D, after the active layer 125 is formed, a gate insulating layer 140 and gate electrode material may be formed on the insulating substrate 100, and the gate electrode material may be patterned to form a gate electrode 150.

After the gate electrode 150 is formed, predetermined impurities may be implanted using the gate electrode 150 as a mask to form source/drain regions 125S and 125D in the active layer 125. In this case, a region between the source/drain regions 125S and 125D may act as a channel region 125C.

After the source/drain regions 125S and 125D are formed, an interlayer insulating layer 160 may be formed on the entire surface of insulating substrate 100 having the gate electrode 150 to have contact holes 161 and 165 for exposing some portions of the source/drain regions 125S and 125D.

After the interlayer insulating layer 160 is formed, source/drain electrodes 171 and 175 electrically connected to the source/drain regions 125S and 125D may be formed through contact holes 161 and 165 to form a thin film transistor.

However, in the thin film transistor fabricated by the above-mentioned process, the thin film transistor may be directly contacted with the crystallization inducing metal to be crystallized when the MIC process is performed, which may cause the crystallization inducing metal to be diffused into the active layer and to be residual.

In this case, when the amount of the crystallization inducing metal contained in the active layer is unnecessarily high, especially when the crystallization inducing metal is Ni and the amount of Ni contained in the active layer is more than $1E+12/cm^2$, off-current and threshold voltage Vth become high, and charge mobility resulted from disturbing charge transfer becomes low. As a result, image quality becomes deteriorated, and fault operation occurs in an active matrix flat panel display using the above-mentioned thin film transistor.

SUMMARY OF THE INVENTION

The present invention provides a thin film transistor and method for fabricating the same, and an active matrix flat panel display using the same, wherein the MIC metal layer is formed beneath a buffer layer, and an MIC process is performed by means of diffusion, and the residual amount of the MIC metal layer in the active layer is adjusted to have excellent characteristics for the thin film transistor.

The present invention accordingly permits MIC to take place in a controlled manner. In some embodiments of the present invention, the metal layer may be formed in area that approximately corresponds to the area for the active layer. In other embodiments, the metal layer may cover a greater area. In an embodiment in which the metal layer covers a greater area, the metal layer may serve as a reflective layer.

BRIEF DESCRIPTION OF THE DRAWINGS

FIG. 3 shows a cross-sectional view for explaining a flat panel display having a thin film transistor in accordance with a second embodiment of the present invention.

DETAILED DESCRIPTION OF THE INVENTION

Figure 1A:
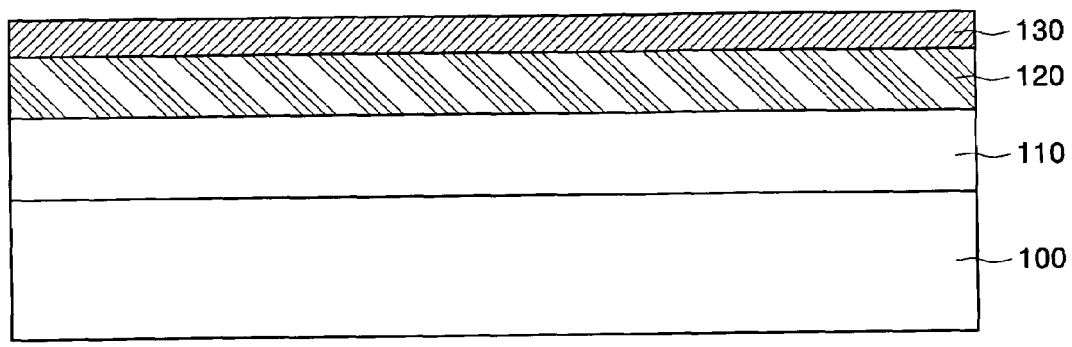
FIGS. 1A, 1B, 1C, and 1D show cross-sectional views of a thin film transistor in the process of fabrication using a conventional metal induced crystallization method.
Figure 1B:
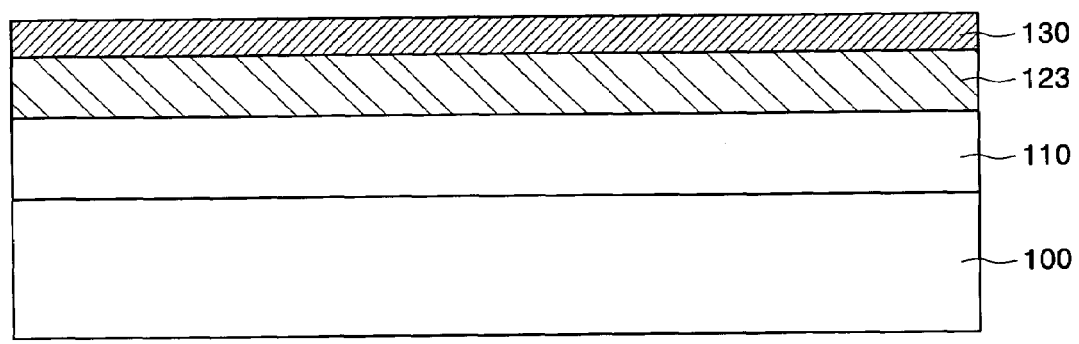
Figure 1C:
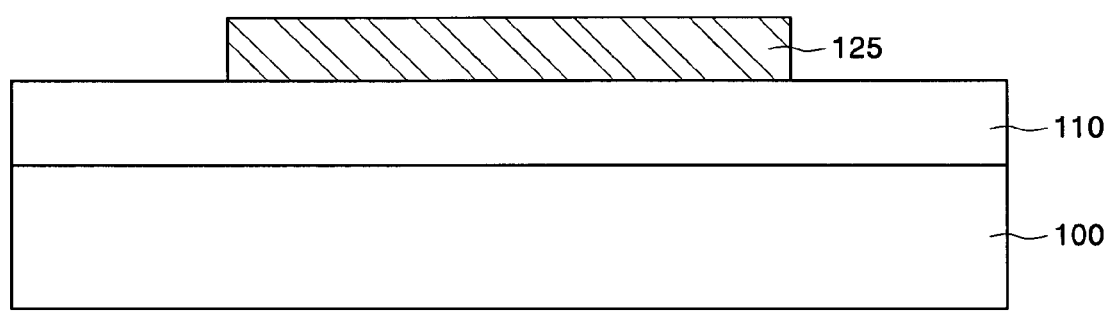
Figure 1D:
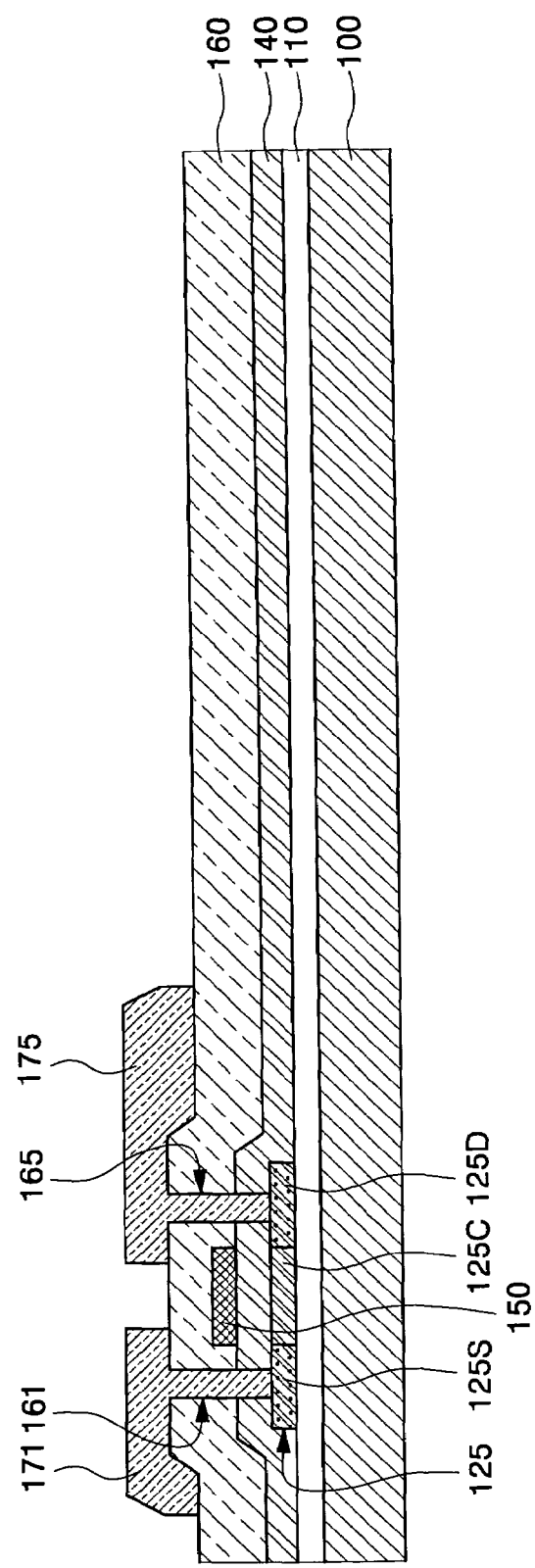

The present invention will now be described more fully hereinafter with reference to the accompanying drawings, in which preferred embodiments of the invention are shown. This invention may, however, be embodied in different forms and should not be construed as limited to the embodiments set forth herein. In the drawings, the thickness of layers and regions are exaggerated for clarity.

First Example Embodiment

FIGS. 2A, 2B, 2C, 2D, and 2E show a progression of cross-sectional views for explaining a thin film transistor using the MIC process and a method for fabricating an active matrix flat panel display using the same in accordance with a first embodiment of the present invention.

The thin film transistor in accordance with the first embodiment of the present invention may include a crystallization inducing metal layer 210 formed on an insulating substrate 200, a buffer layer 220 formed on the crystallization inducing metal layer 210, an active layer 235 formed on the buffer layer 220 and consisted of polycrystalline silicon having source/drain regions 235S and 235D, a gate electrode 250 formed on a gate insulating layer 240, and source/drain electrodes 271 and 275 electrically connected to the source/drain regions 235S and 235D through contact holes 261 and 265 of an interlayer insulating layer 260.

In addition, the active matrix flat panel display in accordance with the first embodiment of the present invention may include a light emitting diode 290 electrically connected to any one of the source/drain electrodes 271 and 275 (for example, it may be connected to the drain electrode 275 through a via hole 285 of a passivation layer 280).

Figure 2A:
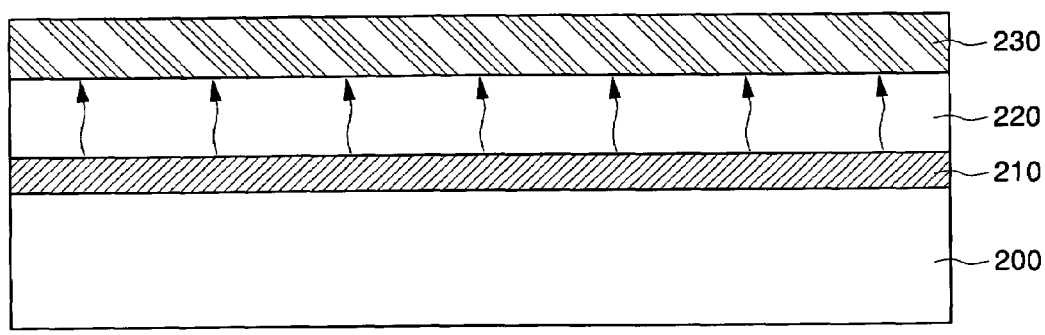
FIGS. 2A, 2B, 2C, 2D, and 2E show cross-sectional views of a thin film transistor in the process of fabrication using an MIC process, as well as the incorporation of such a thin film transistor into an active matrix flat panel display.

As shown in FIG. 2A, the crystallization inducing metal layer 210 for the MIC may be formed on the insulating substrate 200. In this case, the crystallization inducing metal layer 210 may be preferably formed of, for example, one or more of the following: Ni, Al, Pt, Pd, Pb, or Co.

The buffer layer 220, which may act as a diffusion barrier, may be deposited (using PECVD, PLCVD, sputtering, or the like) on the entire surface of the insulating substrate 200 where the crystallization inducing metal layer 210 is already formed. The buffer layer is preferably formed to a thickness of 1000 A to 5000 A, of which material is composed of Si02, SiNx or a double layer made of Si02 and SiNx, that is, Si02/SiNx or SiNx/Si02.

In such a case, the buffer layer 220 may act to prevent impurities from penetrating the active layer (formed of polycrystalline silicon) from the insulating substrate 200, and may act as a sacrificial layer and as a diffusion path to transmit the diffused crystallization inducing metal from the crystallization inducing metal layer 210 into the active layer during MIC.

After the buffer layer 220 is formed, PECVD, PLCVD, sputtering, or the like may be performed to deposit an amorphous silicon layer 230 on the buffer layer 220. A dehydrogenation process may then be performed in a vacuum furnace. When the amorphous Si is deposited using LPCVD or sputtering, the dehydrogenation process may be omitted.

Figure 2B:
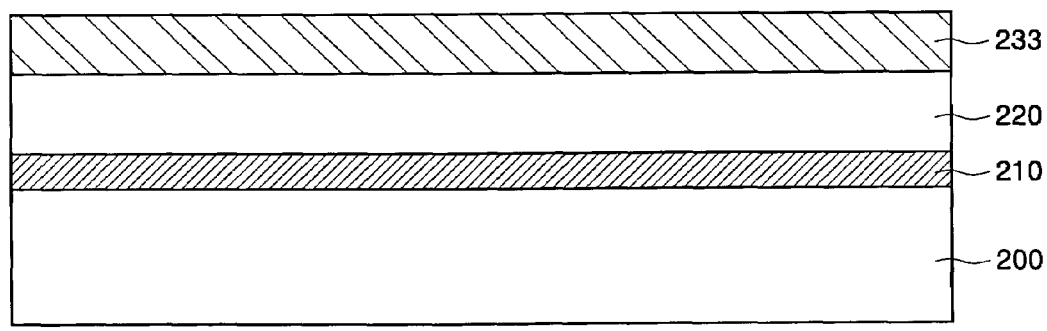

As shown in FIG. 2B, the insulating substrate 200 where the amorphous Si 230 is already formed may be subject to thermal treatment in a furnace to diffuse the crystallization inducing metal into the amorphous Si 230. The MIC process for crystallizing the amorphous Si 230 may then be performed by means of the diffused crystallization inducing metal to form a polycrystalline silicon layer 233.

In this case, the concentration of the crystallization inducing metal contained in the polycrystalline silicon layer 233 may preferably range from about $1E+11/cm^2$ to about $1E+12/cm^2$.

The range may be determined by the following bases. When the concentration of the crystallization inducing metal in the layer exceeds approximately $1E+12/cm^2$, characteristics of the thin film transistor may deteriorate. Similarly, when the concentration is below approximately $1E+11/cm^2$, MIC may be delayed due to a shortage of crystallization inducing metal acting as an MIC catalyst.

Figure 2C:
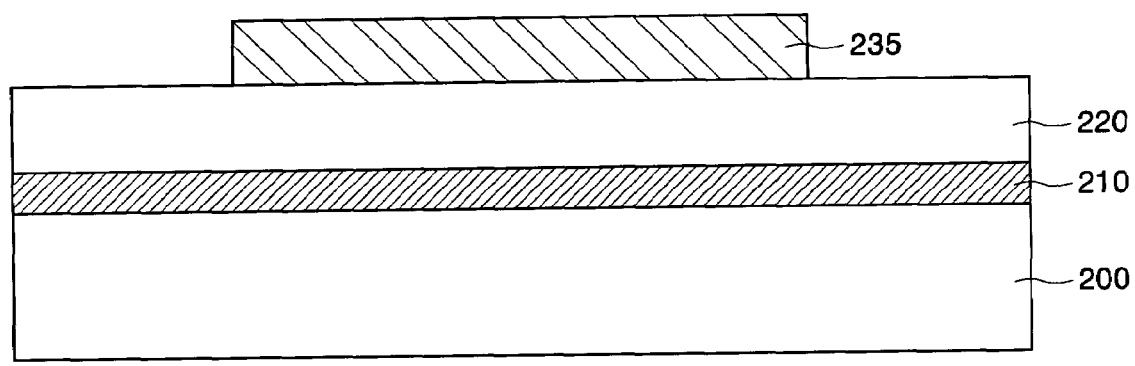

As shown in FIG. 2C, the polycrystalline silicon layer 233 may be patterned to form the active layer 235.

Figure 2D:
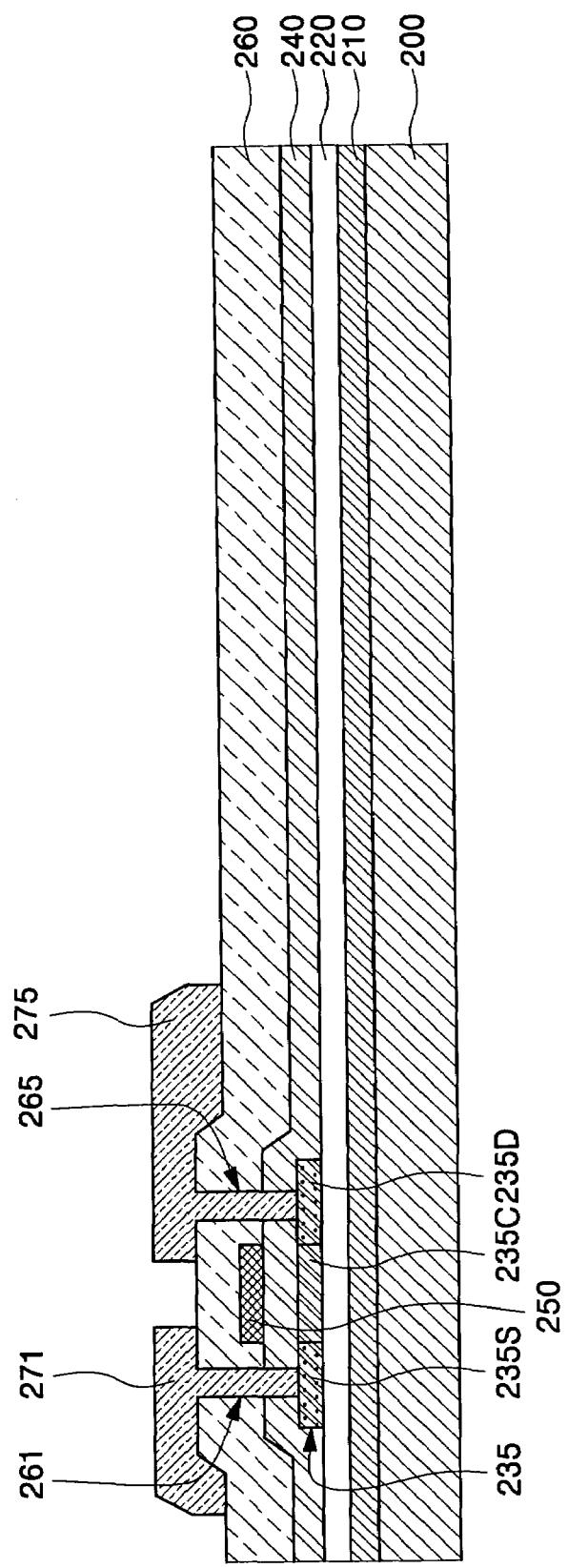

As shown in FIG. 2D, after the active layer 235 is formed, the gate insulating layer 240 and the gate electrode material may be formed on the insulating substrate 200, and the gate electrode material may be patterned to form the gate electrode 250.

After the gate electrode 250 is formed, predetermined impurities may be implanted using the gate electrode 250 as a mask to form source/drain regions 235S and 235D in the active layer 235. In this case, a region between the source/drain regions 235S and 235D may act as a channel region 235C.

After the source/drain regions 235S and 235D are formed, an interlayer insulating layer 260 may be formed on the entire surface of the insulating substrate 200 having the gate electrode 250. Contact holes 261 and 265 may be included to expose portions of the source/drain regions 235S and 235D.

After the interlayer insulating layer 260 is formed, source/drain electrodes 271 and 275 electrically connected to the source/drain regions 235S and 235D may be formed through the contact holes 261 and 265 to form a thin film transistor.

Figure 2E:
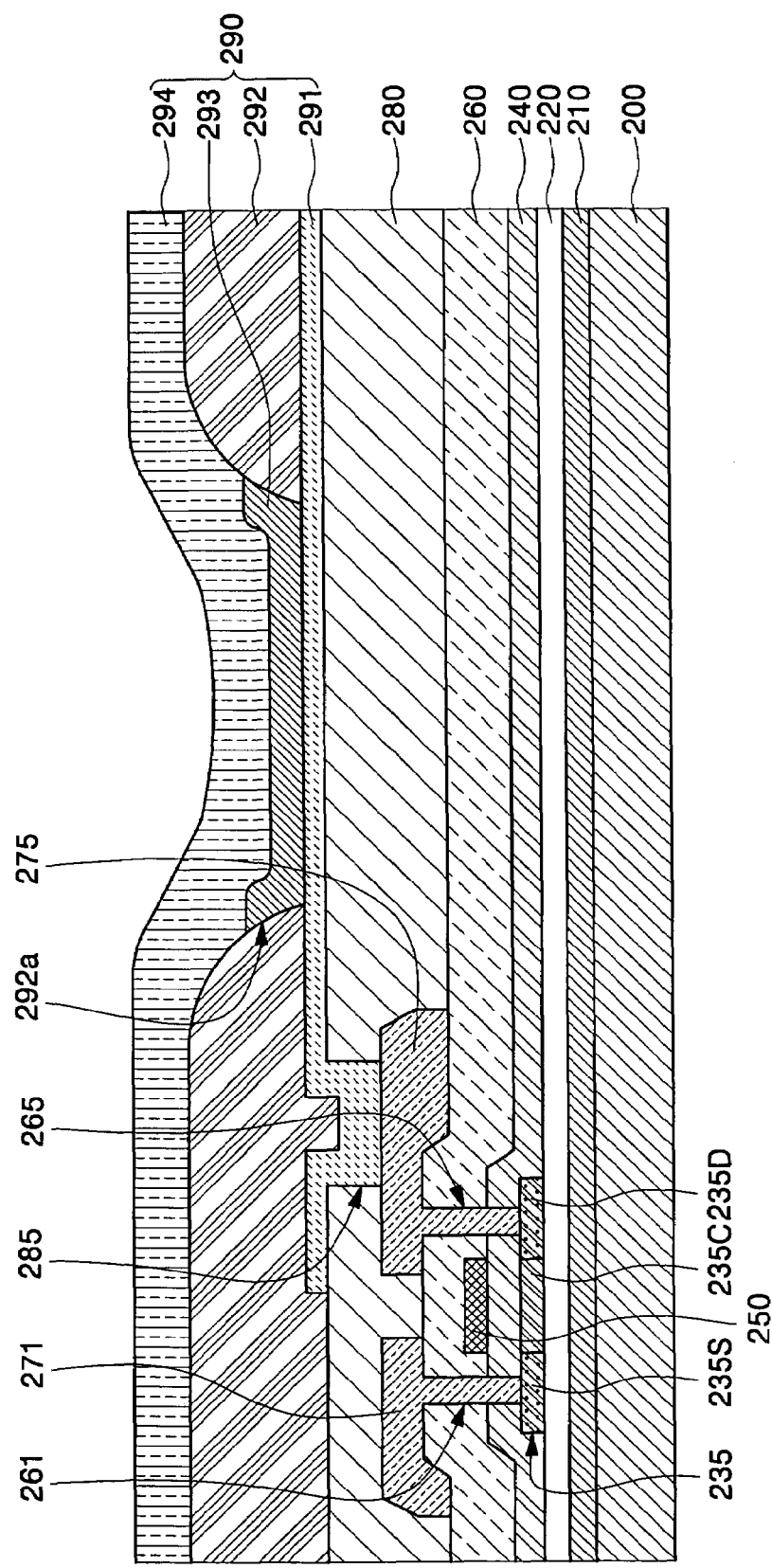

As shown in FIG. 2E, a passivation layer 280 may be formed on the insulating substrate 200 having the thin film transistor to have a via hole 285 for exposing a portion of any one of the source/drain electrodes 271, 275, for example, the drain electrode 275.

After the passivation layer 280 having the via hole 285 is formed, a light emitting diode 290 electrically connected to the drain electrode 275 may be formed to produce an active matrix flat panel display.

In this example, the flat panel display may be an organic light emitting display or a liquid crystal display. In the case of an organic light emitting display, the light emitting diode 290 may be an organic light emitting diode, which may include a lower electrode 291, a pixel defining layer 292 with an opening 292a formed to expose a portion of the lower electrode 291, an organic emission layer 293 formed on the opening 292a, and an upper electrode 294 formed on the entire surface of the insulating substrate 200.

In addition, the organic emission layer 293 may include various layers based on their functions, and may, for example, have a multi-layered structure including an emission layer and at least one of the following: a hole injecting layer (HIL), hole transporting layer (HTL), hole blocking layer (HBL), electron transporting layer (ETL), or electron injecting layer (EIL).

Second Embodiment

FIG. 3 shows a cross-sectional view for explaining a flat panel display having a thin film transistor in accordance with a second embodiment of the present invention.

A flat panel display with a thin film transistor in accordance with the second embodiment may have a structure similar to that having a thin film transistor in accordance with the first embodiment except that a crystallization inducing metal layer 310 may be formed only in the TFT region of the flat panel display. In other words the crystallization inducing metal layer 310 may not, in this example, overlap with the light transmission region of the flat panel display. In such a case, the crystallization inducing metal layer 310 formed only in the TFT region may act to form MIC polycrystalline silicon of an active layer 335 and may also act as a light blocking (or shielding) layer for improving contrast of the flat panel display.

In addition, an active matrix flat panel display in accordance with the second embodiment may include a light emitting diode 390 electrically connected to any one of the source/drain electrodes 371 and 375, (for example, it may be connected to the drain electrode 375 through the via hole 385).

As shown in FIG. 3, a crystallization inducing metal may be deposited and patterned in order to perform a subsequent MIC process on the entire surface of the insulating substrate 300 having an emission region and a TFT region. This may be done in order to form the crystallization inducing metal layer 310 only in the TFT region.

In this case, the crystallization inducing metal layer 310 may be formed only in the TFT region, and may act as a light blocking layer for blocking external light, thereby improving the contrast of the active matrix flat panel display.

After the crystallization inducing metal layer 310 is formed in the TFT region, the buffer layer 320 may be formed on the entire surface of the insulating substrate 300, and an amorphous silicon layer may be formed.

As in the first embodiment, thermal treatment may then be performed to diffuse the crystallization inducing metal of the crystallization inducing metal layer 310. Furthermore, the amorphous silicon layer formed on the buffer layer 320 may be crystallized into polycrystalline silicon by means of MIC and patterned to form the active layer 335.

After the active layer 335 is formed, a gate insulating layer 340 may be formed on the entire surface of the insulating substrate 300 having the active layer 335. A gate electrode 350 may then be formed.

Predetermined impurities may be doped into the active layer 335 using the gate electrode 350 as a mask to form source/drain regions 335S and 335D. In this case, a region between the source/drain regions 335S and 335D acts as a channel region 335C of the thin film transistor.

After the source/drain regions 335S and 335D are formed, as is done in the first embodiment, the gate insulating layer 340, the gate electrode 350, an interlayer insulating layer 360, and source/drain electrodes 371 and 375 may be formed to create the thin film transistor, and a light emitting diode 390 may be electrically connected to any one of the source/drain electrodes 371 and 375 of the thin film transistor through the via hole 385 of the passivation layer 380. Thus a flat panel display may be built.

Figure 4:
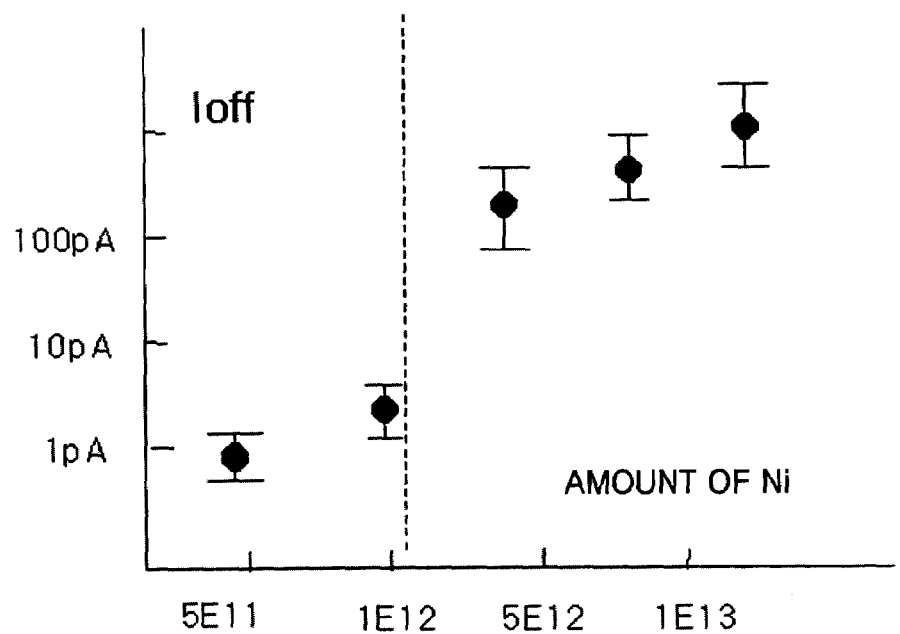
FIG. 4 shows off-current Ioff based on the amount of Ni contained in an active layer of a thin film transistor.
Figure 5:
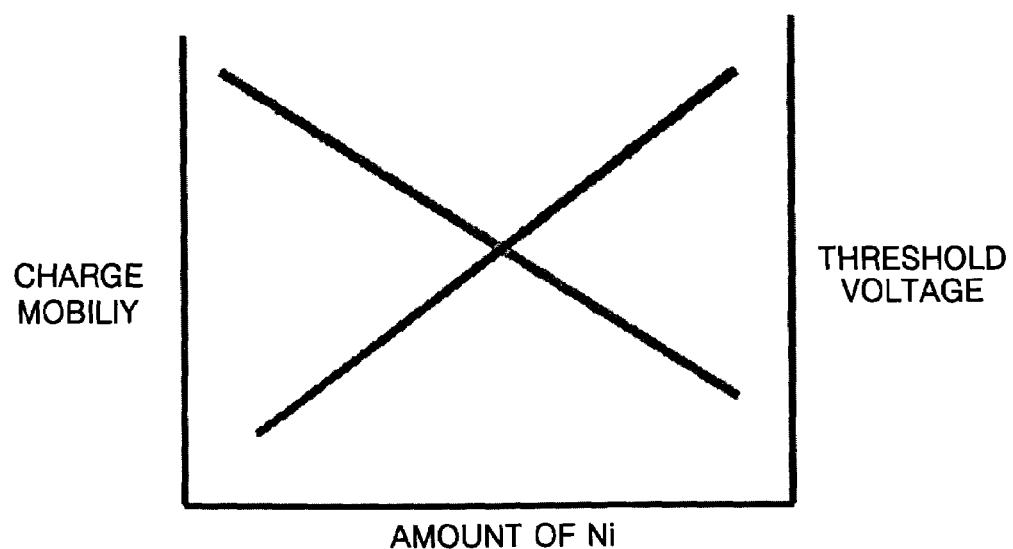
FIG. 5 shows charge mobility and threshold voltage based on the amount of Ni contained in an active layer of a thin film transistor.

FIG. 4 shows off-current Ioff based on the amount of Ni contained in an active layer of a thin film transistor, and FIG. 5 shows charge mobility and threshold voltage based on the amount of Ni contained in an active layer of a thin film transistor.

As shown in FIG. 4, when the concentration of the crystallization inducing metal (for example, Ni) contained in the active layer of the thin film transistor exceeds about $1E+12/cm^2$, the off-current becomes higher than 100 pA, and thus deteriorates the characteristics of the thin film transistor. The data points in FIG. 4 were obtained by the measurement after the manufacturing the test TFT on a small glass while controlling the Ni content using ion implanter which is used for manufacturing semiconductor device.

Furthermore, as shown in FIG. 5, charge mobility and threshold voltage change based on the amount of crystallization inducing metal (for example, Ni) contained in the active layer. In other words, when the amount of, for example, Ni decreases, charge mobility increases and the threshold voltage decreases, thereby resulting in excellent characteristics for the thin film transistor.

In other words, it can be seen that the measure of Ni contained in the active layer may preferably be not more than about $1E+12/cm^2$.

In addition, when the amount of the crystallization inducing metal is below $1E+11/cm^2$, an MIC delay problem may occur due to a shortage of crystallization inducing metal acting as an MIC catalyst. Thus, the measure of crystallization inducing metal contained in the active layer may preferably be not less than about $1E+11/cm^2$.

In accordance with the thin film transistor formed by the above-mentioned process, the amount of crystallization inducing metal to be introduced into the active layer may be adjusted to be less than about $1E+12/cm^2$, so that the off-current and threshold voltage of the thin film transistor may be lowered and a thin film transistor having high charge mobility may be obtained. In addition, the amount of the crystallization inducing metal to be introduced into the active layer may be adjusted to be more than about $1E+11/cm^2$ to prevent the MIC process from being delayed.

Furthermore, in an active matrix flat panel display such as a liquid crystal display or an active matrix organic light emitting display using the flat panel display having the above-mentioned thin film transistor, image quality deterioration and fault operation thereof may be prevented.

In addition, as in the second embodiment, when the crystallization inducing metal layer 310 is formed only in the TFT region, the crystallization inducing metal layer 310 may act as a light blocking layer for blocking external light to improve contrast of the active matrix flat panel display.

While the present invention has been described with reference to particular embodiments, it is understood that the disclosure has been made for purpose of illustrating the invention by way of examples and is not limited to limit the scope of the invention. One skilled in the art can change details of the described embodiments without departing from the scope and spirit of the invention.

What is claimed is:

1. A thin film transistor, comprising:
   a crystalline inducing metal layer formed on a substrate;
   a buffer layer formed on the crystalline inducing metal layer; and
   an active layer formed on the buffer layer and including source/drain regions, and comprising polycrystalline silicon crystallized by metal induced crystallization (MIC), said active layer containing an amount of metallic material ranging from about $1E+11/cm^2$ to about $1E+12/cm^2$ coming from said crystalline inducing metal layer.

2. The thin film transistor of claim 1, wherein the crystalline inducing metal layer is formed of at least any one metallic material selected from a group of Ni, Al, Pt, Pd, Pb, Co, and an alloy thereof.

3. The thin film transistor of claim 1, wherein the buffer layer acts as a diffusion path for the crystalline inducing metal layer.

4. A flat panel display, comprising:
a crystalline inducing metal layer formed on a substrate;
a buffer layer formed on the crystalline inducing metal layer;
an active layer formed on the buffer layer and including source/drain regions, and comprising polycrystalline silicon crystallized by metal induced crystallization (MIC), said active layer containing an amount of metallic material ranging from about $1E+11/cm^2$ to about $1E+12/cm^2$ coming from said crystalline inducing metal layer;
a gate insulating layer formed on the active layer;
a gate electrode formed on the gate insulating layer;
an interlayer insulating layer formed on the gate electrode;
source/drain electrodes electrically connected to the source/drain regions through contact holes of the interlayer insulating layer; and
a light emitting diode electrically connected to at least any one of the source/drain electrodes.

5. The flat panel display of claim 4, wherein the substrate includes an emission region and a TFT region, and the crystalline inducing metal layer is formed only in the TFT region.

6. The flat panel display of claim 5, wherein the crystalline inducing metal layer formed only in the TFT region acts as a light blocking layer for blocking external light.

7. The flat panel display of claim 4, wherein the crystalline inducing metal layer is formed of at least any one metallic material selected from a group of Ni, Al, Pt, Pd, Pb, Co, and an alloy thereof.

8. The flat panel display of claim 4, wherein the buffer layer acts as a diffusion path for the crystalline inducing metal layer.

9. The flat panel display of claim 4, wherein the flat panel display is any one of a liquid crystal display and an organic light emitting display.

* * * * *